US009899104B2

(12) United States Patent
Wang

(10) Patent No.: US 9,899,104 B2
(45) Date of Patent: Feb. 20, 2018

(54) RAID DECODING ARCHITECTURE WITH REDUCED BANDWIDTH

(71) Applicant: Silicon Motion Inc., Hsinchu County (TW)

(72) Inventor: Yu-Luen Wang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 14 days.

(21) Appl. No.: 15/073,665

(22) Filed: Mar. 18, 2016

(65) Prior Publication Data

US 2017/0271029 A1  Sep. 21, 2017

(51) Int. Cl.
*H03M 13/00* (2006.01)
*G11C 29/42* (2006.01)
*G11C 29/44* (2006.01)
*H03M 13/15* (2006.01)
*H03M 13/29* (2006.01)

(52) U.S. Cl.
CPC ............ *G11C 29/42* (2013.01); *G11C 29/44* (2013.01); *H03M 13/1515* (2013.01); *H03M 13/2906* (2013.01)

(58) Field of Classification Search
None
See application file for complete search history.

(56) References Cited

U.S. PATENT DOCUMENTS

| 7,571,372 | B1 * | 8/2009 | Burd | G11B 20/1833 |
| | | | | 714/769 |
| 7,930,586 | B1 * | 4/2011 | Asher | G06F 11/1076 |
| | | | | 714/6.22 |
| 8,522,122 | B2 * | 8/2013 | Alves | G06F 11/10 |
| | | | | 714/758 |
| 8,650,463 | B2 | 2/2014 | Lim | |
| 8,914,687 | B2 | 12/2014 | Gold | |
| 2011/0191649 | A1 * | 8/2011 | Lim | H03M 13/05 |
| | | | | 714/752 |
| 2011/0258520 | A1 * | 10/2011 | Segura | G06F 11/1076 |
| | | | | 714/784 |
| 2012/0266033 | A1 * | 10/2012 | Gold | G06F 11/1052 |
| | | | | 714/718 |
| 2014/0047290 | A1 * | 2/2014 | Lee | G11C 29/10 |
| | | | | 714/719 |

FOREIGN PATENT DOCUMENTS

CN    102222026 A    10/2011
TW    385449         3/2000

* cited by examiner

*Primary Examiner* — Daniel McMahon
(74) *Attorney, Agent, or Firm* — Winston Hsu

(57) ABSTRACT

A RAID decoding system for performing a Built in Self-Test (BIST) includes: an Error Insertion block for inserting errors into a first Reed-Solomon (RS) codeword and a second RS codeword; and a RAID decoder. The RAID decoder includes: a storage, for storing a syndrome of the first codeword, a syndrome of the second codeword, parity data of the first RS codeword and parity data of the second RS codeword; and a first RS decoder and a second RS decoder for storing the first RS codeword and the second RS codeword, respectively, and for performing decoding on the first RS codeword and the second RS codeword according to the parity data to generate an updated syndrome of the first RS codeword and an updated syndrome of the second RS codeword.

6 Claims, 6 Drawing Sheets

RAID DECODING ARCHITECTURE WITH REDUCED BANDWIDTH

BACKGROUND OF THE INVENTION

1. Field of the Invention

The present invention relates to error correcting code (ECC) technology, and more particularly, to a RAID ECC with a reduced bandwidth.

2. Description of the Prior Art

Flash memory is a high performance, low power, non-volatile storage often used in portable devices. A disadvantage of Flash memory is that the cells slowly deteriorate over time meaning the accuracy of a held charge will also decrease. At some point, errors associated with the held charge cannot be corrected, and the cell becomes unusable.

Error Correcting Code (ECC) technology can extend the lifetime of a cell by locating and correcting errors associated with the held charges. One example of an ECC code is low-density parity check (LDPC) decoding, which is a powerful form of ECC technology. Even LDPC codes, however, have a certain probability of failing at a particular Raw Error Bit rate. In cases where a valid codeword cannot be found via LDPC coding, secondary ECC solutions can be provided which detect/correct errors that cannot be remedied by LDPC alone. One example is an encoding RAID check.

RAID is a virtual architecture which combines multiple disk drive components into a single logical unit. By striping codes across multiple disks, mirroring codes in a single disk to generate codes in another disk, and including parity symbols, valid codewords can be retrieved. RAID level 6 uses Reed-Solomon (RS) codes, each code consisting of 2-byte symbols. Data is written to multiple drives with double distributed parity, i.e. two parity blocks are distributed across all member disks. If an LDPC decoder cannot recover a valid codeword, the RAID parity can be used as the secondary ECC.

Data is RAID encoded by being segmented into many chunks and having RAID parity (Reed-Solomon codes) added. The RAID data is then input to an LDPC encoder, and stored in a Flash memory, from where it can be output to an LDPC decoder. After LDPC decoding, if a codeword fails (i.e. LDPC ECC is insufficient to recover correct data), RAID decoding is performed by inputting the non-valid codeword into a RAID engine, and inputting the RAID parity data to generate a syndrome. After a certain number of iterations, the syndrome should satisfy the matrix equations, i.e. it should equal zero. At this point, the original data can be recovered via the updated syndrome.

The drawbacks to the above method are that the RAID engine needs to be able to store an entire codeword, and that parity data of 64 bits (corresponding to four RS symbols) must be inputted to the RAID decoder in each iteration, which occupies a large bandwidth.

SUMMARY OF THE INVENTION

It is therefore an aim of the present invention to provide a Built in Self-Test (BIST) which can save on the bandwidth and storage space required for a RAID decoding engine.

The present invention therefore provides a RAID decoding system for performing a Built in Self-Test (BIST), comprising: an Error Insertion block for inserting errors into a first Reed-Solomon (RS) codeword and a second RS codeword; and a RAID decoder. The RAID decoder comprises: a storage, for storing a syndrome of the first codeword, a syndrome of the second codeword, parity data of the first RS codeword and parity data of the second RS codeword; and a first RS decoder and a second RS decoder for storing the first RS codeword and the second RS codeword, respectively, and for performing decoding on the first RS codeword and the second RS codeword according to the parity data to generate an updated syndrome of the first RS codeword and an updated syndrome of the second RS codeword. When the updated syndrome of the first RS codeword and the updated syndrome of the second RS codeword both equal zero, the updated syndromes of the first and second RS codeword are used to perform error correction on the first and second RS codewords.

In another exemplary embodiment of the present invention, the second RS codeword is a mirror of the first RS codeword so that parity data of the first RS codeword is equal to parity data of the second RS codeword, and the storage only stores parity data of one of the first RS codeword and the second RS codeword, and further stores one of the first RS codeword and the second RS codeword with errors. The MUX inputs the parity data of the first RS codeword and parity data of the second codeword to the first RS decoder and second RS decoder by mirroring the parity data stored in the storage.

These and other objectives of the present invention will no doubt become obvious to those of ordinary skill in the art after reading the following detailed description of the preferred embodiment that is illustrated in the various figures and drawings.

DETAILED DESCRIPTION

The invention provides two embodiments for providing a functional BIST which can perform RAID decoding with a decreased bandwidth as compared to the prior arts.

Figure 1:
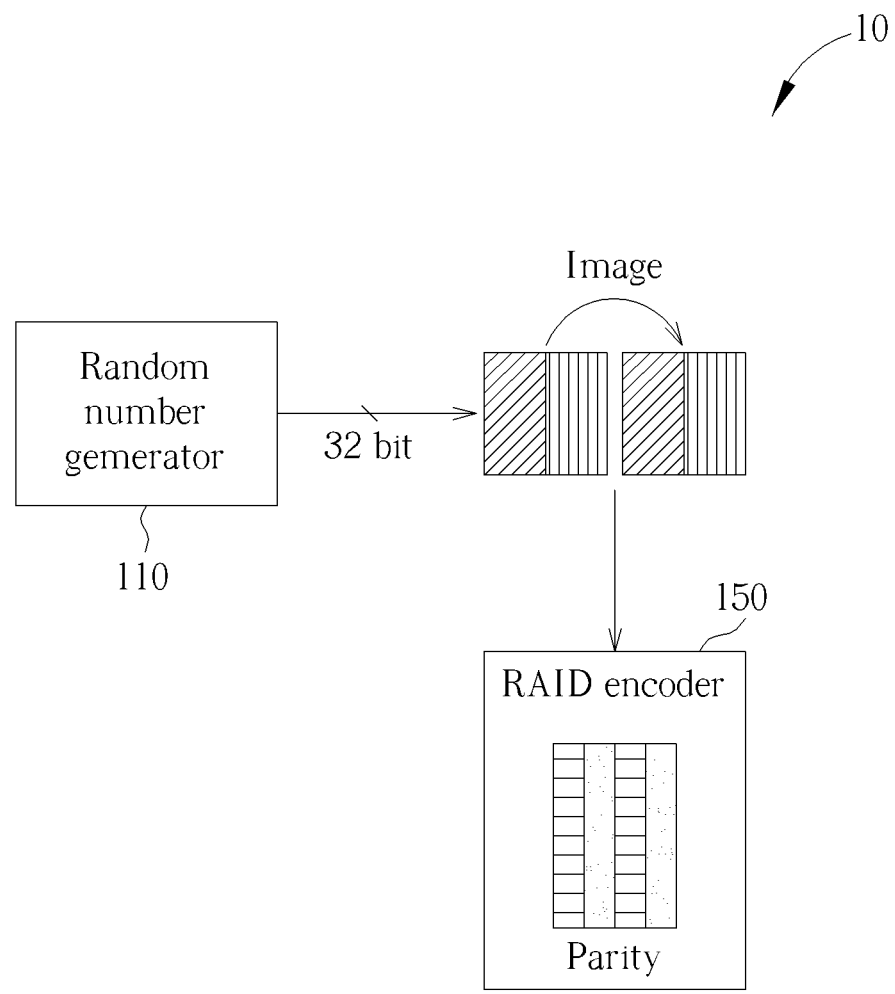
FIG. 1 is a diagram of a RAID encoding system according to the related art.

As detailed in the background, during RAID encoding, data is segmented into chunks and RAID parity is added using Reed-Solomon codes. This is illustrated in FIG. 1, which shows a RAID encoding system 100. The system 100 consists of a Random Number Generator 110 and a RAID encoder 150. In RAID 6, a bandwidth of four RS symbols is used for the encoding, wherein each RS symbol is 2 bytes of data. Therefore, each chunk is coded using 64 bits of data. The data is generated by the Random Number Generator 110, which generates 32 bits of striped data that is then mirrored to create the four RS symbols. These 64 bits of data are then input to the RAID encoder 150 to generate the parity data. As the 64 bits of data are generated by mirroring 32 bits of originally generated data, the parity data can also be generated by mirroring.

A Built-In Self-Test (BIST) enables a system to calibrate its decoding engine by determining that error correction is performed accurately. In a standard BIST, errors are deliberately inserted into the data generated by the Random Number Generator. After decoding is performed, the resultant data can be examined to determine whether the error-free codeword can be recovered, as the exact location and value of the errors is known.

In a prior art BIST, codewords with errors are input and stored in a RAID decoder. Parity data is input to the RAID decoding engine from outside to generate and update syndromes of the codewords, which can then be used to correct the data. The RAID decoding engine therefore needs to store both the corrected codeword and the original codeword with errors. The aim of the embodiments of the present invention is to reduce the bandwidth and required storage of the BIST.

Figure 2:
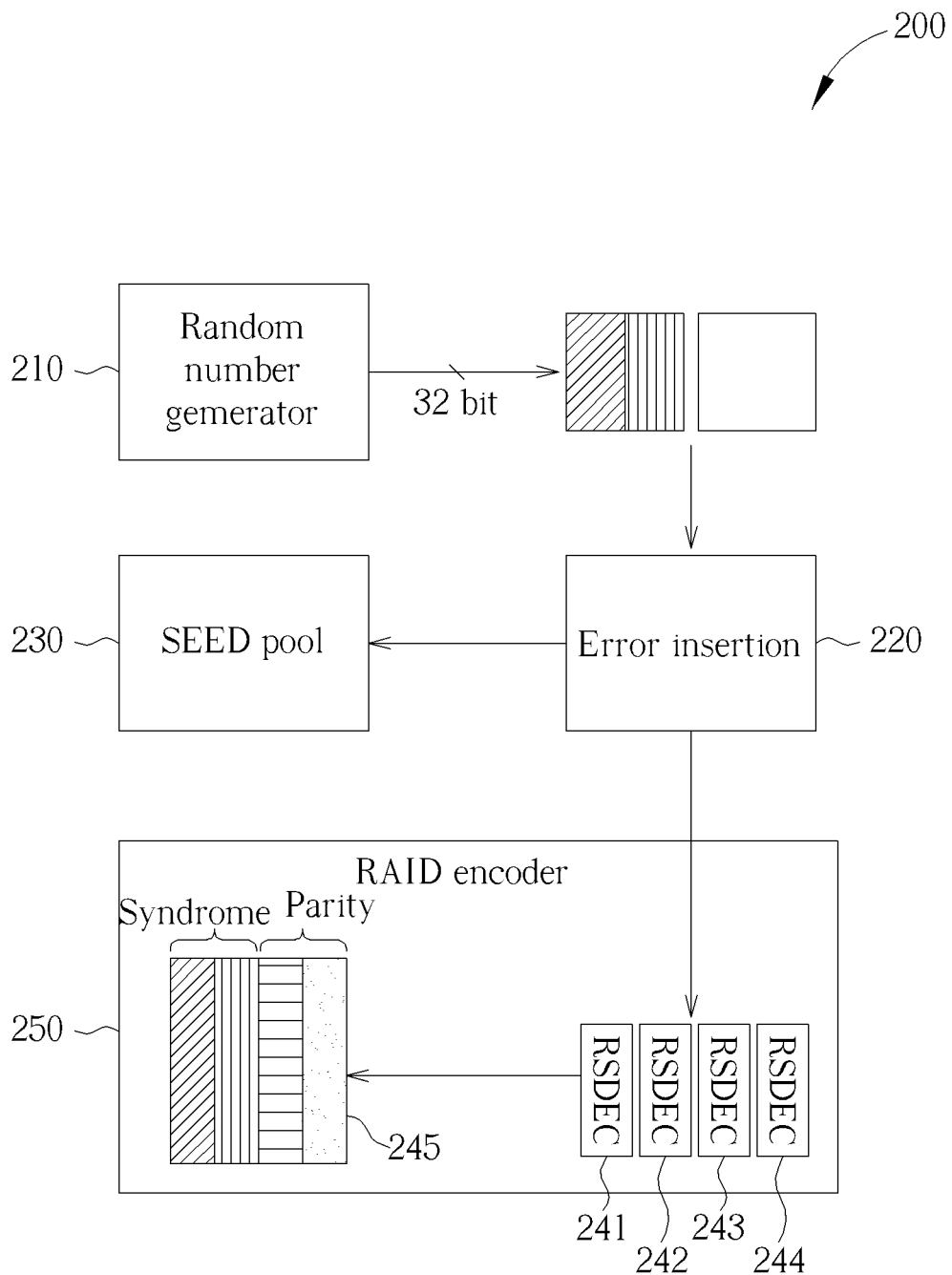
FIG. 2 is a diagram of a RAID decoding system according to a first embodiment of the present invention.

FIG. 2 illustrates a RAID decoding system 200 according to a first exemplary embodiment of the invention. The RAID decoding system 200 comprises a Random Number Generator 210, an Error Insertion block 220, a SEED pool 230, and a RAID decoder 250. The RAID decoder 250 comprises four Reed-Solomon decoding engines 241-244, and a storage 245. When the Random Number Generator 210 generates data, errors will be deliberately inserted by the Error Insertion block 220. This codeword with errors will be input to the RAID decoder 250, and also input to the SEED pool 230, which stores data values identifying each block of the codeword so that the codeword with errors can be recovered later. As in the prior art, the Random Number Generator 220 generates 32 bits of data, but the data will not be mirrored. Only the 32 bits generated by the Random Number Generator 210 and corresponding to two Reed-Solomon codewords are input to the RAID decoder 250.

As only half the data is input to the RAID decoder 250, only half of the RS decoding engines 241~244 need to be used. In this embodiment, RS decoding engines 241 and 242 are illustrated as being used to decode the data. Further, as the storage 245 only needs to store syndromes corresponding to two codewords, the parity data needed to decode the codewords can be stored in the remaining space of the storage 245. It is noted that only half the parity data as compared to the prior art is required because no mirroring has occurred.

Figure 3:
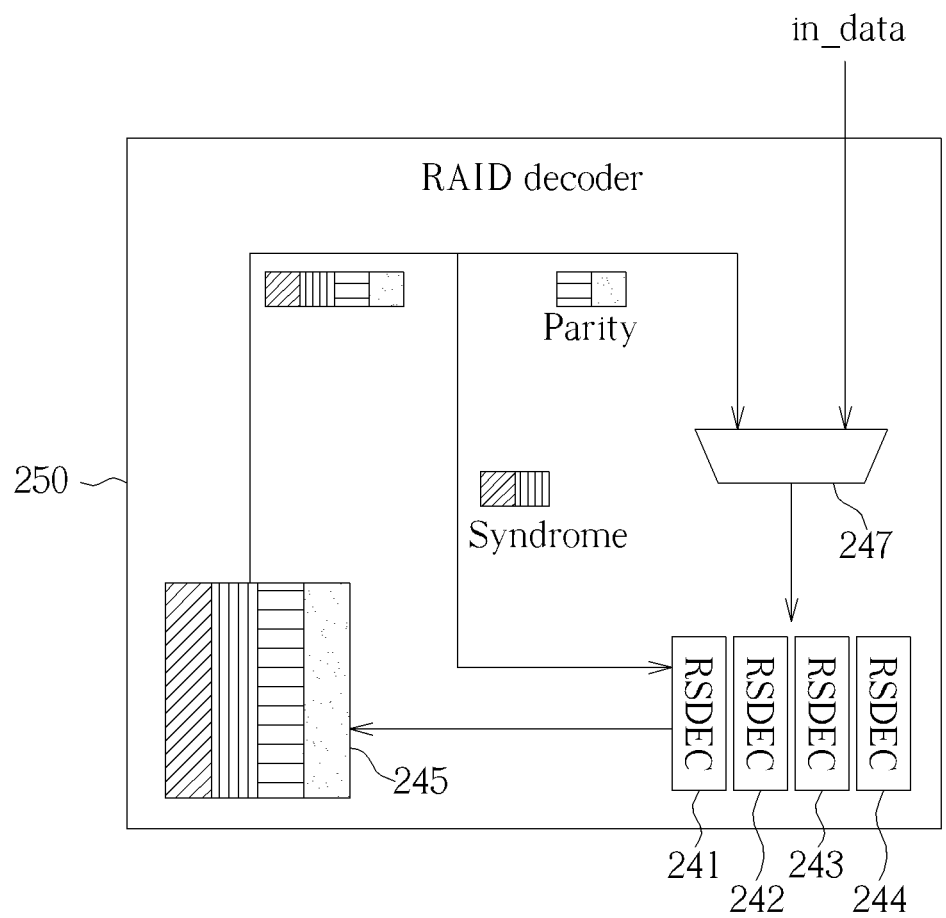
FIG. 3 is a diagram of a RAID decoder of the RAID decoding system shown in FIG. 2.

As illustrated in FIG. 3, the codeword with errors is initially input to the two Reed-Solomon decoding engines 241, 242 in the RAID decoder 250, with the output being sent to the storage 245 for updating a syndrome respectively corresponding to each codeword. In a second iteration, the syndrome and the parity data of the two codewords is input to the RS decoding engines 241, 242 for generating an updated syndrome, wherein selection of the input data or parity data occurs via a MUX 247. The parity data and updated syndromes are re-input for a number of iterations until the syndrome is equal to zero. At this point, a result check can take place.

Figure 4:
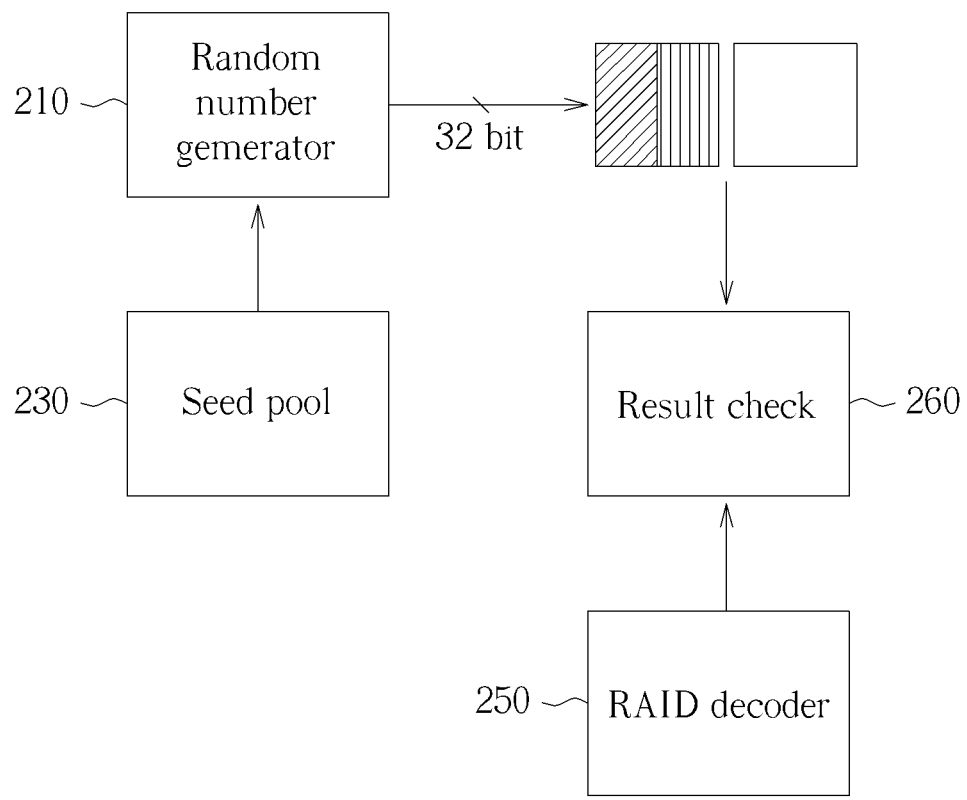
FIG. 4 is a diagram of the RAID decoding system shown in FIG. 2 performing a result check operation.

FIG. 4 illustrates the result check. The SEED pool 230 is used to recover the original codewords with errors, by controlling the Random Number Generator 210 to output 32 bits of data corresponding to the two codewords. The RAID decoder 250 outputs the final updated syndromes of the two codewords and both the original codewords with errors and the final updated syndromes are sent to a Result Check block 260, where the final updated syndromes are used to correct the codewords. As the values and locations of the errors are known, it can be determined whether the RAID decoding system 200 has been able to recover the original codeword.

As well as the above-described embodiment, the present invention provides a second exemplary embodiment which can reduce the bandwidth and simplify the decoding procedure even more.

Figure 5:
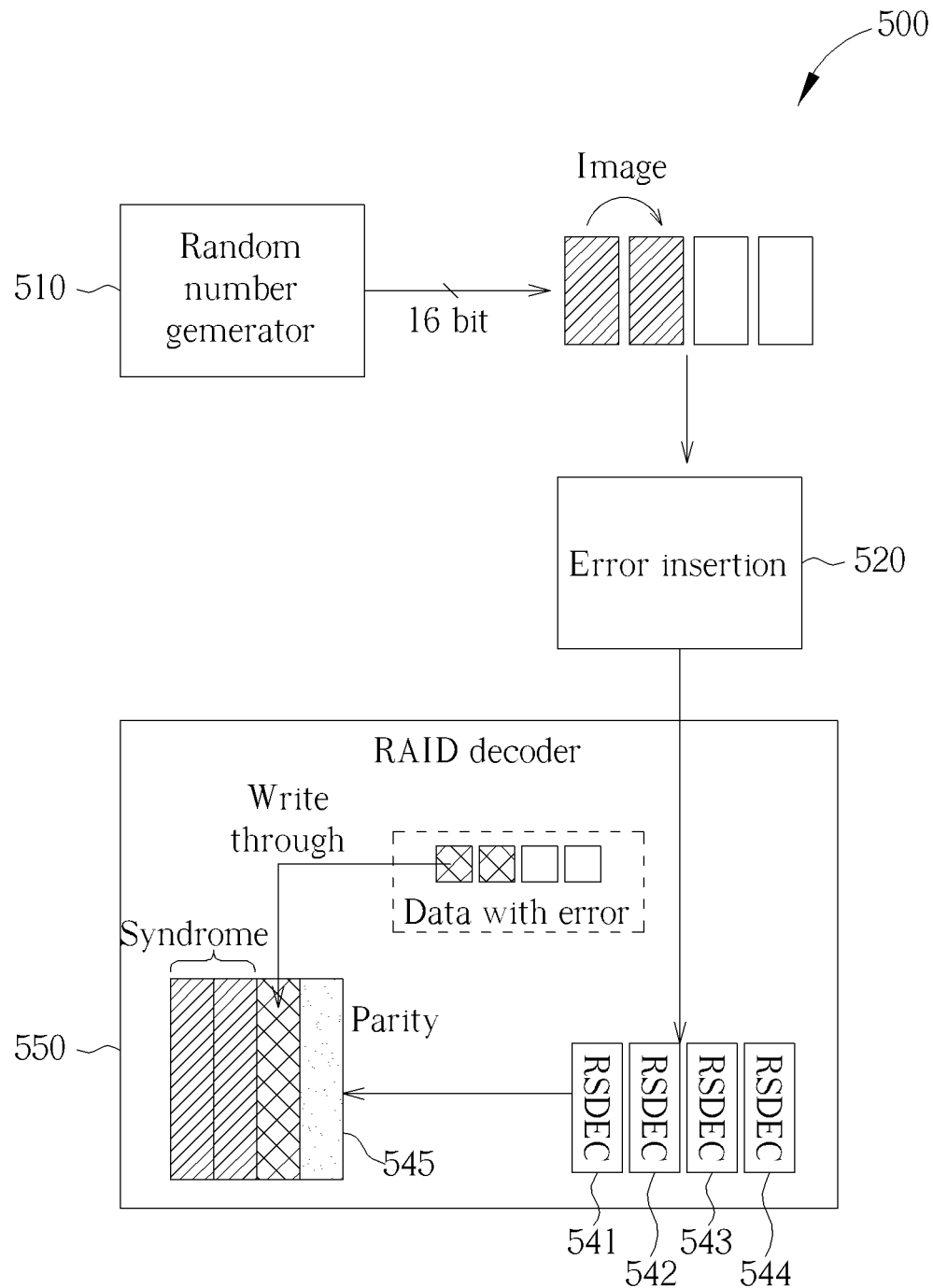
FIG. 5 is a diagram of a RAID decoding system according to a second embodiment of the present invention.

A RAID decoding system 500 according to the second embodiment is illustrated in FIG. 5. The RAID decoding system 500 comprises a Random Number Generator 510, an Error Insertion block 520 and a RAID decoder 550. The RAID decoder 550 comprises four RS decoding engines 541-544, and a storage 545. In this embodiment, the Random Number Generator 510 only outputs 16 bits, which are then mirrored to create 32 bits of data, or two codewords. The two codewords are input to the Error Insertion block 520 and the resultant data is then input to the RAID decoder 550 without being input to a SEED pool. As the 32 bits of data only have one corresponding Reed-Solomon symbol (parity data), only half the storage space used in the first embodiment for storing the parity data is required in this second embodiment. The remaining space is used to directly store one of the codewords with errors. Please note that, as both codewords are identical, this stored codeword is equivalent to both the first and second codeword input, respectively, to RS decoding engines 541, 542.

Figure 6:
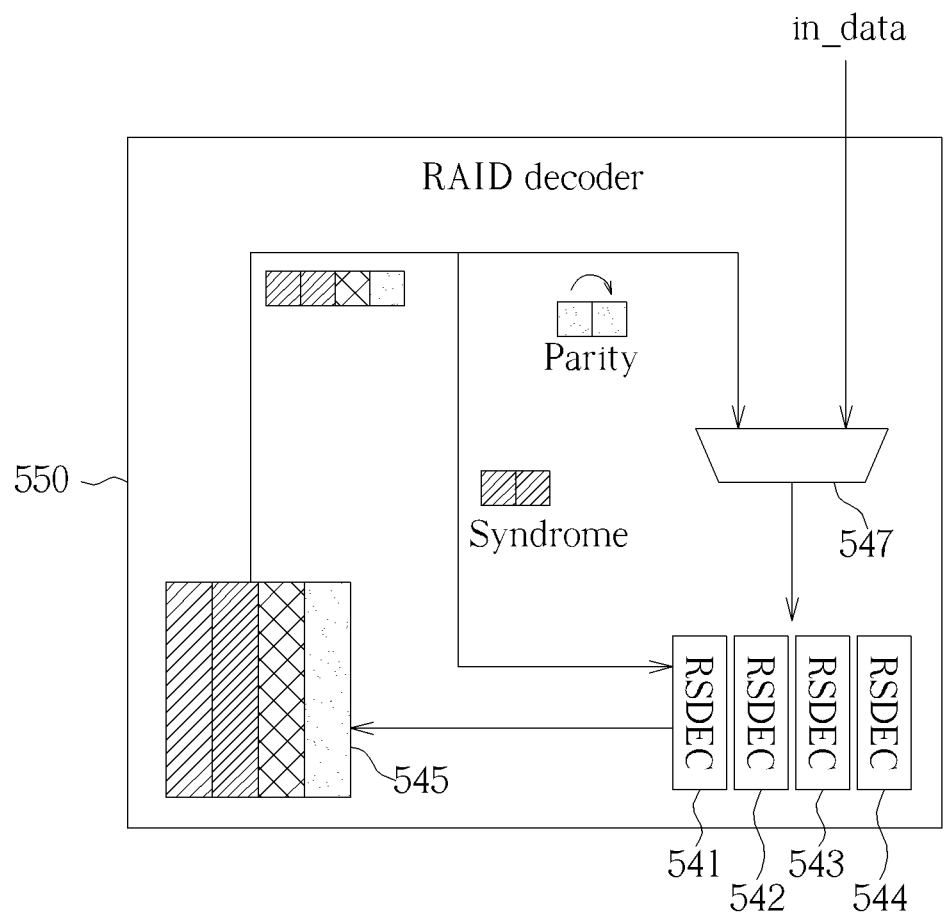
FIG. 6 is a diagram of a RAID decoder of the RAID decoding system shown in FIG. 5.

The decoding process is illustrated in FIG. 6. In a first iteration, the input data (codeword with errors) is input to the RS decoding engines 541, 542 and used to generate the syndromes for the codewords, which will be identical to each other if both RS decoding engines are operating correctly. In a next iteration, the parity is directly input to the two RS decoders 541, 542 via a MUX 547, but the parity is first mirrored before being input. The syndromes are updated accordingly, wherein if both RS decoders are functioning normally, the syndromes should be the same. When the updated syndrome is equal to zero, this indicates that the errors can be corrected, and the final updated syndrome is used to perform ECC on the codewords.

In this embodiment, the RAID decoder 550 stores both the corrected codewords and the original codeword with errors. Therefore, all these values can be directly output to the Result Check module 260 for confirming that all errors have been located and corrected.

The above invention therefore provides two embodiments of functional BIST for a RAID decoder, wherein the bandwidth is reduced as compared to the prior art, and no external storage is required.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A RAID decoding system for performing a Built in Self-Test (BIST), comprising:
   an Error Insertion block for inserting errors into a first Reed-Solomon (RS) codeword and a second RS codeword; and
   a RAID decoder, comprising:
      a storage, for storing a syndrome of the first RS codeword, a syndrome of the second RS codeword, parity data of the first RS codeword and parity data of the second RS codeword;
      a first RS decoder for storing the first RS codeword and for performing decoding on the first RS codeword according to the parity data of the first RS codeword to generate an updated syndrome of the first RS codeword;
      a second RS decoder for storing the second RS codeword and for performing decoding on the second RS codeword according to the parity data of the second RS codeword to generate an updated syndrome of the second RS codeword; and a MUX, coupled between the storage and the first RS decoder and the second RS decoder, for inputting the first RS codeword to the first RS decoder and inputting the second RS codeword to the second RS decoder in a first iteration, and for inputting the parity data of the first RS codeword to the first RS decoder and inputting the parity data of the second RS codeword to the second RS decoder in following iterations for updating the syndrome of the first RS codeword and the syndrome of the second RS codeword;

wherein when the updated syndrome of the first RS codeword and the updated syndrome of the second RS codeword both equal zero, the updated syndromes of the first RS codeword and the second RS codeword are used to perform error correction on the first RS codeword and the second RS codeword to generate an error-corrected first RS codeword and an error-corrected second RS codeword.

2. The RAID decoding system of claim 1, further comprising:

a Random Number Generator, for generating data to the Error Insertion block; and a SEED pool, coupled between the Error Insertion block and the Random Number Generator, for storing values corresponding to the first RS codeword and the second RS codeword with errors inserted, and using those values to control the Random Number Generator to generate the first RS codeword and the second RS codeword with errors inserted when the updated syndrome of the first RS codeword and the updated syndrome of the second RS codeword both equal zero.

3. The RAID decoding system of claim 2, further comprising:

a Result Check block, coupled to the Random Number Generator and the RAID decoder, for receiving the first RS codeword and the second RS codeword with errors inserted and the error-corrected first RS codeword and the error-corrected second RS codeword, and determining correctness of the data.

4. The RAID decoding system of claim 1, wherein the first RS codeword is mirrored to generate the second RS codeword so that the second RS codeword is an exact copy of the first RS codeword and the parity data of the first RS codeword is equal to the parity data of the second RS codeword, and the storage only stores the parity data of one of the first RS codeword and the second RS codeword, and further stores one of the first RS codeword and the second RS codeword before error correction is performed.

5. The RAID decoding system of claim 4, wherein the MUX inputs the parity data of the first RS codeword to the first RS decoder and inputs the parity data of the second RS codeword to the second RS decoder by mirroring the parity data stored in the storage to generate duplicated data which is an exact copy of the parity data.

6. The RAID decoding system of claim 4, further comprising:

a Result Check block, coupled to the RAID decoder, for receiving the one of the first RS codeword with errors inserted and the second RS codeword with errors inserted and the error-corrected first RS codeword and the error-corrected second RS codeword, and determining correctness of the data.

* * * * *